US012809145B2

(12) United States Patent
Seo et al.

(10) Patent No.: US 12,809,145 B2

(45) Date of Patent: Nov. 24, 2026

(54) OPTICAL SYSTEM AND LASER DEVICE INCLUDING THE SAME

(71) Applicant: Samsung Display Co., Ltd., Yongin-Si (KR)

(72) Inventors: Jongoh Seo, Yongin-si (KR); Ji-Hwan Kim, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 342 days.

(21) Appl. No.: 18/379,545

(22) Filed: Oct. 12, 2023

(65) Prior Publication Data

US 2024/0280794 A1 Aug. 22, 2024

(30) Foreign Application Priority Data

Feb. 21, 2023 (KR) ........................ 10-2023-0023076

(51) Int. Cl.

| | |
|---|---|
| ***G02B 19/00*** | (2006.01) |
| ***H01S 5/00*** | (2006.01) |
| *G02B 5/10* | (2006.01) |

(52) U.S. Cl.

CPC ........ *G02B 19/0028* (2013.01); *H01S 5/0071* (2013.01); *G02B 5/10* (2013.01)

(58) Field of Classification Search

CPC .... G02B 19/00; G02B 19/0028; G02B 17/08; G02B 17/0621; G02B 27/09; G02B 27/0927; G02B 27/0961; G02B 27/0983; G02B 27/0916; G02B 27/28; G02B 27/286; G02B 5/10; G02B 13/22; H01S 5/00; H01S 5/0071; H01S 3/08; H01S 3/081; H01S 3/08004; H01S 3/0811; H01S 3/0085

USPC .... 359/727, 719, 855, 853, 859, 869; 372/9, 372/29.02, 29.014, 26

See application file for complete search history.

(56) References Cited

U.S. PATENT DOCUMENTS

| | | | | |
|---|---|---|---|---|
| 4,974,919 A * | 12/1990 | Muraki | ............... | G03F 7/70566 362/268 |
| 6,084,842 A * | 7/2000 | Miura | .................. | G11B 7/1362 369/44.37 |
| 2022/0063015 A1 | 3/2022 | Kim et al. | | |

FOREIGN PATENT DOCUMENTS

| | | | | |
|---|---|---|---|---|
| JP | H0697047 * | 4/1994 | ............. | G03B 27/32 |
| KR | 10-2013-0005162 A | 1/2013 | | |
| KR | 10-2016-0041488 A | 4/2016 | | |
| KR | 10-2022-0030401 A | 3/2022 | | |

OTHER PUBLICATIONS

Sheldakova et al, "Stacked-actuators deformable mirror vs bimorph mirror for laser beam shaping", Proc of SPIE vol. 10904, Mar. 21, 2019 (Year: 2019).*

(Continued)

*Primary Examiner* — Jie Lei

(74) *Attorney, Agent, or Firm* — Innovation Counsel LLP

(57) ABSTRACT

An optical system includes a first lens including a first surface and a second surface opposite to the first surface and having a first focal length, a second lens including a third surface and a fourth surface opposite to the third surface and having a second focal length, and a curved mirror disposed on a traveling path of a first laser beam passing through the first lens and changing the traveling path of the first laser beam to enter the second lens by reflecting the first laser beam.

15 Claims, 6 Drawing Sheets

(56) References Cited

OTHER PUBLICATIONS

Wetzig et al, "Developments in beam scanning (remote) technologies and smart beam processing"; Hand book of Laser welding technologies; Woodhead publishing in Electronic and optical materials; 2013, p. 422-433 (Year: 2013).*
English translation of JP H0697047. (Year: 1994).*

* cited by examiner

OPTICAL SYSTEM AND LASER DEVICE INCLUDING THE SAME

CROSS-REFERENCE TO RELATED APPLICATION(S)

This application claims priority under 35 U.S.C. § 119 to Korean Patent Application No. 10-2023-0023076 filed on Feb. 21, 2023 in the Korean Intellectual Property Office (KIPO), the disclosure of which is incorporated by reference herein in its entirety.

1. TECHNICAL FIELD

Embodiments of the disclosure relate to an optical system. More particularly, embodiments of the disclosure relate to an optical system and a laser device including the same.

2. DESCRIPTION OF THE RELATED ART

As a method for crystallizing an amorphous silicon layer into a polycrystalline silicon layer, solid phase crystallization (SPC), metal induced crystallization (MIC), metal induced lateral crystallization (MILC), and excimer laser annealing (ELA) are used. For example, the excimer laser annealing for crystallizing amorphous silicon into polycrystalline silicon using a laser beam is mainly used in a manufacturing process of an organic light emitting display device or a liquid crystal display device.

A laser device used in the excimer laser annealing (ELA) includes a laser generator that generates a source laser beam. The source laser beam is a raw laser beam that is not processed and has a rectangular cross section having a major axis and a minor axis. The source laser beam has energy distribution of a Gaussian distribution in both the major axis direction and the minor axis direction. The Gaussian distribution refers to a normal distribution that is laterally symmetrical about the mean.

However, if the energy distribution of the source laser beam is out of the normal distribution, defects may occur during the crystallization process. In order to prevent the occurrence of the defects, complex optical systems have been developed to remove shaking of the laser beam, but there may be problems in that light efficiency is lowered because a large number of optical lenses may be required, space may be limited, and beam alignment may be difficult.

SUMMARY

Embodiments of the disclosure provide an optical system.

Embodiments of the disclosure provide a laser device including the optical system.

An optical system according to an embodiment of the disclosure includes a first lens, a second lens, and a curved mirror. The first lens may include a first surface and a second surface opposite to the first surface, and the first lens may have a first focal length. The second lens may include a third surface and a fourth surface opposite to the third surface, and the second lens may have a second focal length. The curved mirror may be disposed on a traveling path of a first laser beam passing through the first lens, and the curved mirror may change the traveling path of the first laser beam to enter the second lens by reflecting the first laser beam.

In an embodiment, a focal point of the first lens may be a first focal point and a focal point of the second lens may be a second focal point. The first focal point may be between the first lens and the curved mirror and the second focal point may be between the curved mirror and the second lens.

In an embodiment, the first focal length may be smaller than the second focal length.

In an embodiment, magnification between the first lens and the curved mirror may be greater than or equal to about 1.2 and less than or equal to about 1.6. The magnification may be defined as a value obtained by dividing the second focal length by the first focal length.

In an embodiment, the second lens may be positioned to form an image at a position where the first laser beam reflected from the curved mirror is a sum of the first focal length and the second focal length.

In an embodiment, a separation distance between the first lens and a center of the curved mirror may be a same as a separation distance between the second lens and the center of the curved mirror.

In an embodiment, the curved mirror may have a concave curved surface shape.

In an embodiment, a radius of curvature of the curved mirror may be greater than or equal to about 500 millimeters and less than or equal to about 1500 millimeters.

In an embodiment, an optical axis of the first lens and an optical axis of the second lens may be perpendicular to each other.

In an embodiment, the second surface of the first lens and the third surface of the second lens may be adjacent to the curved mirror. The first surface may have a convex curved shape in a direction from the first surface of the first lens toward the second surface. The fourth surface may have a convex curved shape in a direction from the fourth surface of the second lens toward the third surface.

In an embodiment, each of the first lens and the second lens may be a telecentric lens.

A laser device according to an embodiment of the disclosure includes a beam generator and an optical system. The beam generator may emit a first laser beam. The optical system may include a first lens, a second lens, and a curved mirror. The first lens may include a first surface and a second surface opposite to the first surface, and the first lens may have a first focal length. The second lens may include a third surface and a fourth surface opposite to the third surface, and the second lens may have a second focal length. The curved mirror may be disposed on a traveling path of the first laser beam passing through the first lens, and the curved mirror may change the traveling path of the first laser beam to enter the second lens by reflecting the first laser beam.

In an embodiment, magnification between the first lens and the curved mirror may be greater than or equal to about 1.2 and less than or equal to about 1.6. The magnification may be defined as a value obtained by dividing the second focal length by the first focal length.

In an embodiment, the second lens may be positioned to form an image at a position where the first laser beam reflected from the curved mirror is a sum of the first focal length and the second focal length.

In an embodiment, a separation distance between the first lens and a center of the curved mirror may be a same as a separation distance between the second lens and the center of the curved mirror.

In an embodiment, the curved mirror may have a concave curved surface shape.

In an embodiment, a radius of curvature of the curved mirror may be greater than or equal to about 500 millimeters and less than or equal to about 1500 millimeters.

In an embodiment, an optical axis of the first lens and an optical axis of the second lens may be perpendicular to each other.

In an embodiment, the second surface of the first lens and the third surface of the second lens may be adjacent to the curved mirror. The first surface may have a convex curved shape in a direction from the second surface of the first lens toward the first surface. The fourth surface may have a convex curved shape in a direction from the third surface of the second lens toward the fourth surface.

In an embodiment, each of the first lens and the second lens may be a telecentric lens.

An optical system according to an embodiment of the disclosure may include a first lens, a second lens, and a curved mirror. The first lens may include a first surface and a second surface opposite to the first surface, and the first lens may have a first focal length. The second lens may include a third surface and a fourth surface opposite to the third surface, and the second lens may have a second focal length. The curved mirror may be disposed on a traveling path of a first laser beam passing through the first lens, and the curved mirror may change the traveling path of the first laser beam to enter the second lens by reflecting the first laser beam. Accordingly, beam dispersion may be enhanced, an additional part capable of enhancing the beam dispersion may be reduced, and a size of crystallization equipment may be minimized by omitting the additional part.

DETAILED DESCRIPTION OF THE EMBODIMENTS

Figure 1:
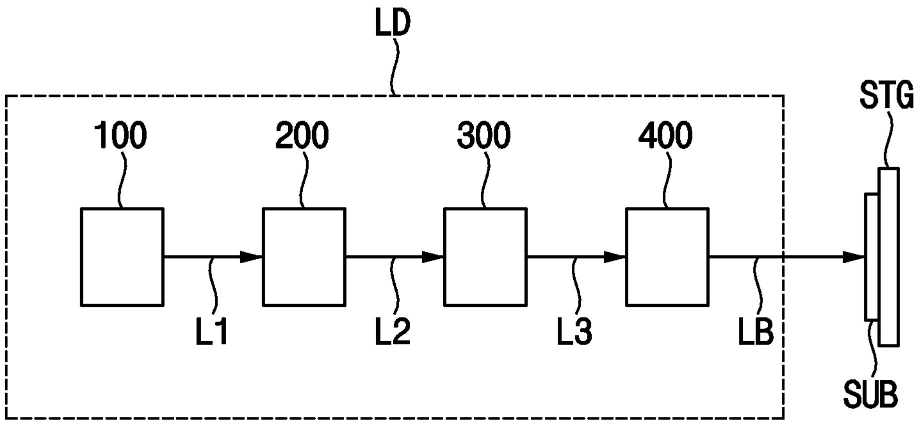
FIG. 1 is a block diagram of a laser device according to an embodiment of the disclosure.

Hereinafter, embodiments of the disclosure will be described in more detail with reference to the accompanying drawings. The same reference numerals may be used for the same components in the drawings, and thus, redundant descriptions of the same components may be omitted.

FIG. 1 is a block diagram of a laser device LD according to an embodiment of the disclosure.

Referring to FIG. 1, the laser device LD according to an embodiment of the disclosure may irradiate a laser beam LB to a substrate SUB disposed on a stage STG. The laser device LD, the stage STG, and the substrate SUB may be disposed in a process chamber. For example, the process chamber may be a vacuum chamber, a positive pressure chamber, or the like.

The laser device LD according to an embodiment of the disclosure may include a beam generator 100, a beam converter 200, a beam homogenizer 300, and a beam concentrator 400.

Each of the beam converter 200, the beam homogenizer 300, and the beam concentrator 400 may include at least one lens. A further detailed description of the lens will be provided later with reference to FIG. 2.

The beam generator 100, the beam converter 200, the beam homogenizer 300, and the beam concentrator 400 may be arranged in a direction. The direction may be defined as a direction parallel to an optical axis of at least one lens included in the beam converter 200. A further detailed description of the optical axis will be provided later with reference to FIG. 2.

The substrate SUB may be disposed between the beam concentrator 400 and the stage STG. FIG. 1 shows that the stage STG is disposed adjacent to a side of the beam concentrator 400 in a direction, however, embodiments of the disclosure are not limited thereto. For example, the stage STG may be disposed under the beam concentrator 400. In this case, a reflective member or the like may be further disposed adjacent to the beam concentrator 400 to irradiate light output from the beam concentrator 400 to the substrate SUB disposed on the stage STG.

The beam generator 100 may emit a first laser beam L1. In an embodiment, the first laser beam L1 may be a linear laser beam. The first laser beam L1 may be provided to the beam converter 200.

The beam converter 200 may receive the first laser beam L1 from the beam generator 100 and may expand the first laser beam L1. However, embodiments of the disclosure are not limited thereto, and the beam converter 200 may output the first laser beam L1 as is or narrow the first laser beam L1. In an embodiment, the beam converter 200 may expand the first laser beam L1 and output it as a second laser beam L2. The second laser beam L2 may be provided to the beam homogenizer 300.

The beam homogenizer 300 may receive the second laser beam L2 from the beam converter 200 and may split the second laser beam L2. In an embodiment, the beam homogenizer 300 may split the second laser beam L2 and may output it as a plurality of third laser beams L3. The plurality of third laser beams L3 may be provided to the beam concentrator 400.

The beam concentrator 400 may concentrate the plurality of third laser beams L3. In an embodiment, the beam concentrator 400 may concentrate the plurality of third laser beams L3 and may output them as the laser beam LB. The laser beam LB may be provided to the substrate SUB.

The laser beam LB may be irradiated to the substrate SUB. For example, the laser beam LB may be formed using XeCl, XeF, Nd-YAG lasers, or the like. In an embodiment, a peak wavelength of the laser beam LB may be about 308 nanometer (nm), about 351 nm, and about 532 nm, respectively.

The laser beam LB may perform a crystallization process. For example, a semiconductor layer may be disposed on the substrate SUB. The semiconductor layer may include amorphous silicon (a-Si). When the laser beam LB is irradiated, the amorphous silicon may be crystallized into crystalline silicon (poly-Si). That is, as the laser beam LB is irradiated, the semiconductor layer may include the poly-silicon.

Figure 2:
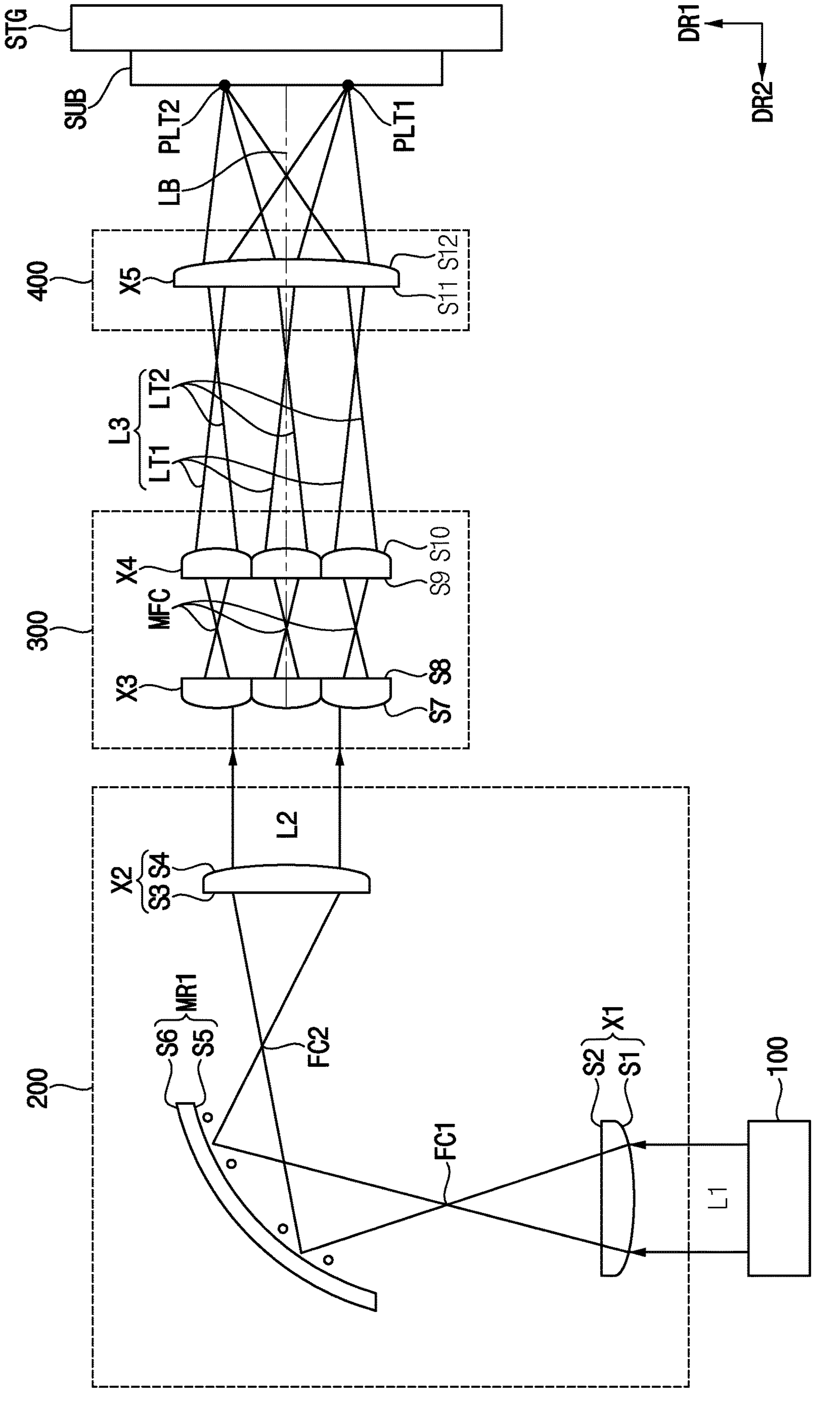
FIGS. 2 and 3 are views illustrating an optical system included in the laser device of FIG. 1.
Figure 3:
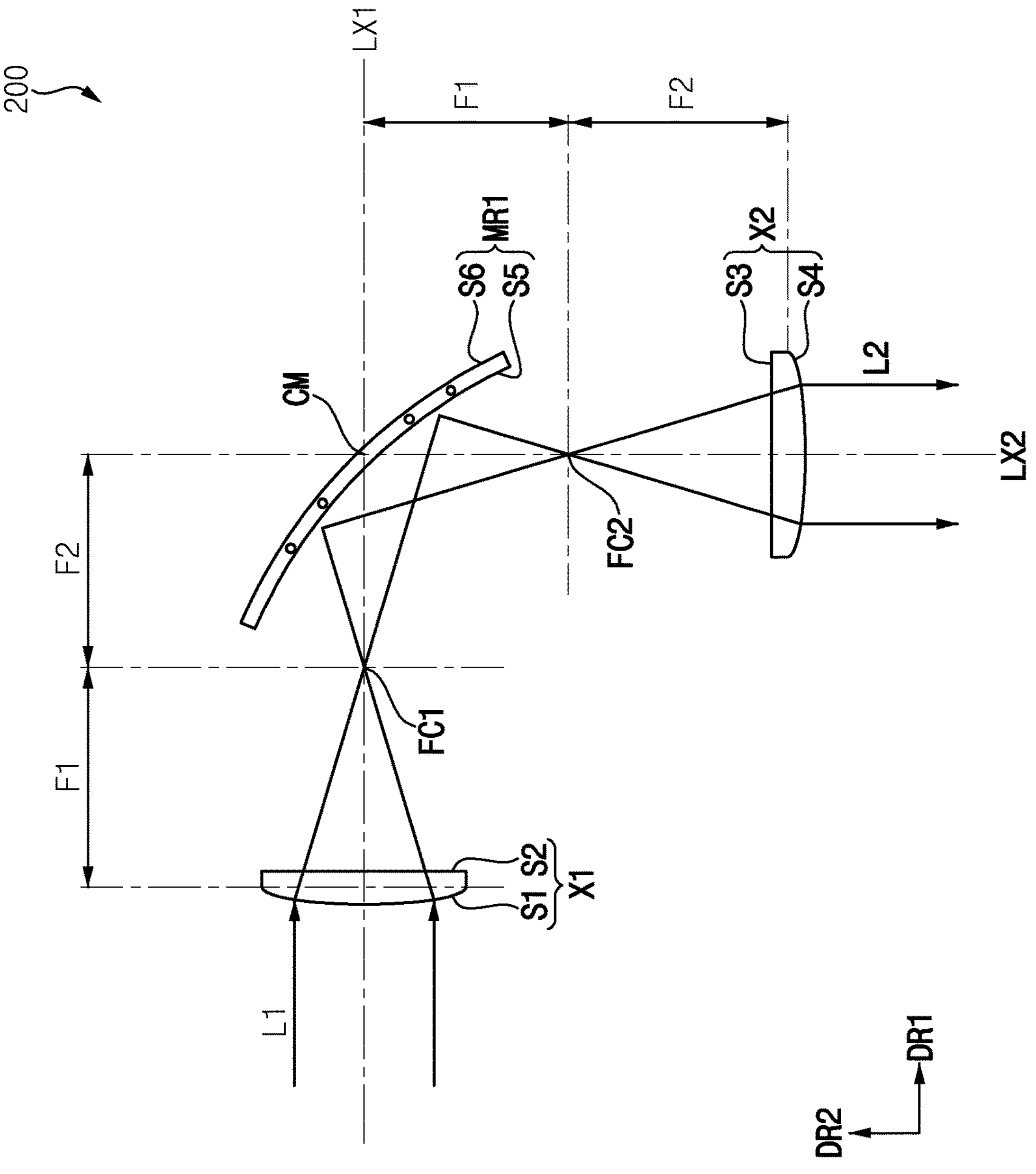

FIGS. 2 and 3 are views illustrating an optical system included in the laser device of FIG. 1.

For example, FIG. 2 is a view illustrating at least one lens included in each of the beam converter 200, the beam homogenizer 300, and the beam concentrator 400 included in the laser device LD of FIG. 1. FIG. 3 is an enlarged view illustrating the beam converter 200.

Referring to FIGS. 2 and 3, the beam converter 200 may convert the first laser beam L1 into the second laser beam L2 having a same phase as a re-inverted phase of the first laser beam L1.

In an embodiment, the beam converter 200 may include a first lens X1, a second lens X2, and a curved mirror MR1.

In an embodiment, the first lens X1 may include a first surface S1 and a second surface S2. The second surface S2 may be opposite to the first surface S1. The first lens X1 may have a first focal length F1. The first focal length F1 may be defined as a distance between the first lens X1 and a first focal point FC1 described later.

The first surface S1 may be a surface on which the first laser beam L1 is incident. More specifically, the first surface S1 may be adjacent to the beam generator 100.

The second surface S2 may be a surface from which the first laser beam L1 passing through the first lens X1 is emitted. The second surface S2 may be adjacent to the curved mirror MR1.

The second lens X2 may include a third surface S3 and a fourth surface S4. The fourth surface S4 may be opposite to the third surface S3. The second lens X2 may have a second focal length F2. The second focal length F2 may be defined as a distance between the second lens X2 and a second focal point FC2 described later.

The third surface S3 may be a surface on which the first laser beam L1 reflected at the curved mirror MR1 is incident. The third surface S3 may be adjacent to the curved mirror MR1.

The fourth surface S4 may be a surface from which the first laser beam L1 passing through the second lens X2 is emitted. More specifically, the fourth surface S4 may be adjacent to the beam homogenizer 300.

In an embodiment, the first focal length F1 may be smaller than the second focal length F2. For example, the second focal length F2 may be greater than or equal to about 1.2 times and less than or equal to about 1.6 times the first focal length F1. A detailed description of the focal length will be described later.

The curved mirror MR1 may include a fifth surface S5 and a sixth surface S6. The sixth surface S6 may be opposite to the fifth surface S5.

Specifically, the fifth surface S5 may be a surface on which the first laser beam L1 passing through the first lens X1 is incident. More specifically, the fifth surface S5 may adjacent to the second surface S2 of the first lens X1 and the third surface S3 of the second lens X2.

In an embodiment, the curved mirror MR1 may be disposed on a traveling path of the first laser beam L1 passing through the first lens X1. The first laser beam L1 passing through the first lens X1 may be reflected at the curved mirror MR1, and may be incident to the second lens X2.

In an embodiment, the curved mirror MR1 may be spaced apart from the first lens X1 in a first direction DR1 by a distance obtained by adding the first focal length F1 and the second focal length F2. For example, the curved mirror MR1 may be spaced apart from the first lens X1 by about 2.2 times or more and about 2.6 times or less of the first focal length F1 in the first direction DR1.

In addition, the curved mirror MR1 may be spaced apart from the second lens X2 in a second direction DR2 by a distance obtained by adding the first focal length F1 and the second focal length F2. For example, the curved mirror MR1 may be spaced apart from the second lens X2 by about 2.2 times or more and about 2.6 times or less of the first focal length F1 in the second direction DR2. The second direction DR2 may cross the first direction DR1. For example, the second direction DR2 may be perpendicular to the first direction DR1.

In other words, a separation distance between the first lens X1 and the curved mirror MR1 may be a same as a separation distance between the second lens X2 and the curved mirror MR1.

In an embodiment, each of the first lens X1 and the second lens X2 may be a lens having a spherical cross-section when cut in a direction perpendicular to the first direction DR1 and the second direction DR2.

In a cross-sectional view of FIGS. 2 and 3, the first surface S1 may have a convex curved surface shape, and the second surface S2 may have a substantially flat surface shape. Specifically, the first surface S1 may have the convex curved surface shape in a direction from the first surface S1 toward the second surface S2, e.g., in the first direction DR1. The second surface S2 may have the flat surface shape parallel to the second direction DR2.

The third surface S3 of the second lens X2 may have a substantially flat surface shape, and the fourth surface S4 may have a convex curved surface shape. Specifically, the fourth surface S4 may have the convex curved surface shape in a direction from the fourth surface S4 toward the third surface S3, e.g., in the second direction DR2. The third surface S3 may have the flat surface shape parallel to the first direction DR1.

However, embodiments of the disclosure are not limited thereto. The first surface S1 of the first lens X1 may have the flat surface shape, and the second surface S2 may have the curved surface shape. Alternatively, both the first surface S1 and the second surface S2 of the first lens X1 may have the curved surface shape. In addition, the fourth surface S4 of the second lens X2 may have the flat surface shape, and the third surface S3 may have the curved surface shape. Alternatively, both the third surface S3 and the fourth surface S4 of the second lens X2 may have the curved shape.

In an embodiment, the curved mirror MR1 may be a concave mirror. Specifically, each of the fifth and sixth surfaces S5 and S6 may have the concave curved surface. More specifically, each of the fifth and sixth surfaces S5 and S6 may have the concaved curved surface shape in a direction from the fifth surface S5 toward the sixth surface S6, e.g., a direction between the first direction DR1 and the second direction DR2.

In an embodiment, a radius of curvature of the curved mirror MR1 may be greater than or equal to about 500 millimeters (mm) and less than or equal to about 1500 millimeters.

When the radius of curvature of the curved mirror MR1 is less than about 500 mm or greater than about 1500 mm, the second laser beam L2 may deviate from the predetermined path. In addition, when the radius of curvature of the curved mirror MR1 exceeds about 1500 mm, a size of equipment may increase.

In an embodiment, the first lens X1 and the second lens X2 may have different optical axes. For example, an optical axis LX1 of the first lens X1 and an optical axis LX2 of the second lens X2 may be perpendicular to each other. Accordingly, the first laser beam L1 provided parallel to the first direction DR1 from the beam generator 100 passes through the beam converter 200 and the second laser beam L2 parallel to the second direction DR2 may be provided to the beam homogenizer 300. The optical axes of the lenses included in the beam homogenizer 300 and the beam concentrator 400 may be parallel to the optical axis LX2 of the second lens X2 or may share the optical axis LX2 of the second lens X2.

In an embodiment, the first laser beam L1 may be inverted while passing through the beam converter 200, and then converted into the re-inverted second laser beam L2. Accordingly, the first laser beam L1 and the second laser beam L2 may have the same phase.

The first lens X1 may be spaced apart from the beam generator 100 in the first direction DR1 by the first focal length F1. The first laser beam L1 provided from the beam generator 100 may pass through the first lens X1.

The first laser beam L1 passing through the first lens X1 may be focused at the first focal point FC1. The first focal point FC1 may be a focal point of the first lens X1. The first focal point FC1 may be between the first lens X1 and the curved mirror MR1. As described above, a distance between the first lens X1 and the first focal point FC1 may be defined as the first focal length F1.

In an embodiment, each of the first lens X1 and the curved mirror MR1 may be positioned to satisfy the following magnification. A magnification between the first lens X1 and the curved mirror MR1 may be greater than or equal to about 1.2 and less than or equal to about 1.6. The magnification may be defined as a value obtained by dividing the second focal length F2 by the first focal length F1.

The beam dispersion may increase when the second focal length F2 is less than about 1.2 times the first focal length F1 or when the second focal length F2 exceeds about 1.6 times the first focal length F1. When the beam dispersion occurs, the crystallization process may not occur in a portion in the substrate SUB. Accordingly, the second focal length F2 may be greater than or equal to about 1.2 times the first focal length F1 and less than or equal to about 1.6 times the first focal length F1.

The normal irradiation portion may be defined as a portion of the substrate SUB to which the second laser beam L2 is incident to normally perform the crystallization process. When the second laser beam L2 is irradiated to the normal irradiation portion, the crystallization process may be normally performed. On the other hand, when the second laser beam L2 is irradiated on a portion outside the normal irradiated portion, the crystallization process may not occur in a portion in the substrate SUB.

Concentrated at the first focal point FC1 and then inverted, the first laser beam L1 may be reflected at the curved mirror MR1. As described above, the curved mirror MR1 may be spaced apart from the first lens X1 in the first direction DR1 by a sum of the first focal length F1 and the second focal distance F2. Specifically, a center CM of the curved mirror MR1 may be spaced apart from the first lens X1 in the first direction DR1 by the sum of the first focal length F1 and the second focal length F2.

The first laser beam L1 reflected at the curved mirror MR1 may be focused at the second focal point FC2. The second focal point FC2 may be a focal point of the second lens X2. The second focal point FC2 may be between the second lens X2 and the curved mirror MR1. As described above, a distance between the second lens X2 and the second focal point FC2 may be defined as the second focal length F2.

The second lens X2 may be positioned to form an image at a position where the first laser beam L1 reflected from the curved mirror MR1 is a sum of the first focal length F1 and the second focal length F2.

In an embodiment, the first laser beam L1 concentrated at the second focal point FC2 and then re-inverted may pass through the second lens X2. As described above, the curved mirror MR1 may be spaced apart from the second lens X2 in the second direction DR2 by the sum of the first focal length F1 and the second focal length F2. Specifically, the center CM of the curved mirror MR1 may be spaced apart from the second lens X2 in the second direction DR2 by the sum of the first focal length F1 and the second focal length F2. In other words, the separation distance between the first lens X1 and the curved mirror MR1 may be the same as the separation distance between the second lens X2 and the curved mirror MR1.

The beam homogenizer 300 may be spaced apart from the second lens X2 by the second focal length F2 in the direction opposite to the second direction DR2. The second laser beam L2 provided from the second lens X2 may be incident to the beam homogenizer 300.

In an embodiment, each of the first lens X1 and the second lens X2 may be a telecentric lens.

As the first lens X1 and the second lens X2 are provided as the telecentric lenses, the second laser beam L2 passing through the second lens X2 may be provided to the beam homogenizer 300 parallel to the second direction DR2.

In a laser device according to a comparative embodiment, a beam path may be changed as the second laser beam L2 sequentially passing through the first lens X1 and the second lens X2 is reflected by the reflective mirror. In this case, the beam dispersion may increase while reflected by the reflective mirror.

In order to reduce the beam dispersion, the telecentric lens may be additionally disposed on the path of the laser beam reflected by the reflective mirror. In this case, an additional space in which the telecentric lens may be disposed is required, and thus the equipment may become large, and costs may increase due to the additional part, e.g., the telecentric lens.

In addition, as a length of a section through which the laser beam passes through the telecentric lenses increases, the dispersion of the laser beam may decrease. Accordingly, loss of the laser beam may be reduced, and occurrence of a defect such as horizontal stripes may be reduced in an annealing process, i.e., the crystallization process, using the laser beam.

The optical system and the laser device LD including the optical system according to an embodiment of the disclosure may include the curved mirror MR1, and the curved mirror MR1 may be disposed in the path of the first laser beam L1 passing through the first lens X1. The first laser beam L1 may be incident to the second lens X2 after being reflected at the curved mirror MR1. That is, the curved mirror MR1 may change the path of the first laser beam L1.

As described above, the second lens X2 may be the telecentric lens. Accordingly, the beam dispersion of the first laser beam L1 may be improved while passing through the second lens X2 after being reflected at the curved mirror MR1.

In addition, the curved mirror MR1 may be between the first lens X1 and the second lens X2. Accordingly, the beam dispersion may be further improved while changing the beam path compared to the laser device according to the comparative embodiment, and unlike the laser device according to the comparative embodiment, so the size of the equipment may be minimized by omitting the additional part, and the cost due to the additional part may be reduced.

In an embodiment, the beam homogenizer 300 may include a plurality of third lenses X3 and a plurality of fourth lenses X4.

The plurality of third lenses X3 may be disposed between the second lens X2 and the plurality of fourth lenses X4. The plurality of fourth lenses X4 may be disposed between the plurality of third lenses X3 and the beam concentrator 400. In an embodiment, the plurality of fourth lenses X4 may be arranged to correspond 1:1 to the plurality of third lenses X3 in the second direction DR2. Accordingly, each of the plurality of fourth lenses X4 may face a corresponding fourth lenses X4 of the plurality of third lenses X3 in the second direction DR2.

The plurality of third lenses X3 may include a plurality of seventh surfaces S7 and a plurality of eighth surfaces S8. The plurality of fourth lenses X4 may include a plurality of ninth surfaces S9 and a plurality of tenth surfaces S10.

The plurality of seventh surfaces S7 may be surfaces on which the second laser beam L2 is incident. The plurality of seventh surfaces S7 may face the second lens X2.

The plurality of eighth surfaces S8 may be surfaces from which the second laser beam L2 passing through the plurality of third lenses X3 is emitted. The plurality of eighth surfaces S8 may face the plurality of fourth lenses X4.

The plurality of ninth surfaces S9 may be surfaces on which the second laser beam L2 is incident. More specifically, the plurality of ninth surfaces S9 may face the plurality of third lenses X3.

The plurality of tenth surfaces S10 may be surfaces from which the second laser beam L2 passing through the plurality of fourth lenses X4 is emitted as the third laser beams L3. The plurality of tenth surfaces S10 may face the beam concentrator 400.

Each of the plurality of third lenses X3 and the plurality of fourth lenses X4 may be a single-convex lens.

In the cross-sectional view, the plurality of seventh surfaces S7 may have a convex curved surface, and the plurality of eighth surfaces S8 may have a substantially flat surface. More specifically, each of the plurality of seventh surfaces S7 may have the convex curved surface shape in a direction from the plurality of seventh surfaces S7 toward the plurality of eighth surfaces S8, e.g., in a direction opposite the second direction DR2, and the plurality of eighth surfaces S8 may have the flat surface shape parallel to the first direction DR1.

In an embodiment, the plurality of tenth surfaces S10 may have the convex curved surface shape, and the plurality of ninth surfaces S9 may have the flat surface shape. The plurality of tenth surfaces S10 may have the convex curved surface shape in a direction from the plurality of tenth surfaces S10 toward the plurality of ninth surfaces S9, e.g., in the second direction DR2, and the plurality of ninth surfaces S9 may have the flat surface shape parallel to the first direction DR1.

However, embodiments of the disclosure are not limited thereto. For example, the plurality of seventh surfaces S7 may have the flat surface shape, and the plurality of eighth surfaces S8 may have the curved surface shape. Alternatively, both the plurality of seventh surfaces S7 and the plurality of eighth surfaces S8 may have the curved surface shape.

In addition, the plurality of tenth surfaces S10 may have the flat surface shape, and the plurality of ninth surfaces S9 may have the curved surface shape. Alternatively, both the plurality of tenth surfaces S10 and the plurality of ninth surfaces S9 may have the curved surface shape.

In an embodiment, each of the plurality of third lenses X3 and the plurality of fourth lenses X4 may have a same size as each other. Each of the plurality of third lenses X3 and the plurality of fourth lenses X4 may be arranged side by side in the first direction DR1. In FIG. 2, it is illustrated that each of the plurality of third lenses X3 and the plurality of fourth lenses X4 is three, however, embodiments of the disclosure are not limited thereto.

The second laser beam L2 output from the second lens X2 may be split into a plurality of beams while passing through the beam homogenizer 300. The plurality of beams may be concentrated at a plurality of focal points MFC, expanded again, and emitted as the plurality of third laser beams L3. The plurality of focal points MFC may be between the plurality of third lenses X3 and the plurality of fourth lenses X4.

The beam concentrator 400 may include a fifth lens X5. The fifth lens X5 may include an eleventh surface S11 and a twelfth surface S12. The fifth lens X5 may be a condensing lens.

The eleventh surface S11 may face the plurality of fourth lenses X4. The eleventh surface S11 may be a surface on which the plurality of third laser beams L3 are incident.

The twelfth surface S12 may opposite to the eleventh surface S11. The twelfth surface S12 may be a surface from which the laser beam LB passing through the fifth lens X5 is omitted.

The fifth lens X5 may be the single-convex lens. For example, in the cross-sectional view, the eleventh surface S11 may have a flat surface shape parallel to the first direction DR1, and the twelfth surface S12 may have a convex curved surface shape in a direction from the twelfth surface S12 to the eleventh surface S11, e.g., in the second direction DR2.

However, embodiments of the disclosure are not limited thereto. The eleventh surface S11 may have the flat surface shape, and the twelfth surface S12 may have the curved surface shape. Alternatively, both the eleventh surface S11 and the twelfth surface S12 may have curved surface shapes.

The plurality of third laser beams L3 may be concentrated while passing through the fifth lens X5. For example, the plurality of third laser beams L3 may include parallel first lights LT1, and second lights LT2. The second lights LT2 may cross the first lights LT1 and may be parallel to each other. The first lights LT1 may be focused on a first point PLT1 of the substrate SUB while passing through the fifth lens X5, and the second lights LT2 may be focused on a second point PLT2 of the substrate SUB while passing through the fifth lens X5.

Figure 4:
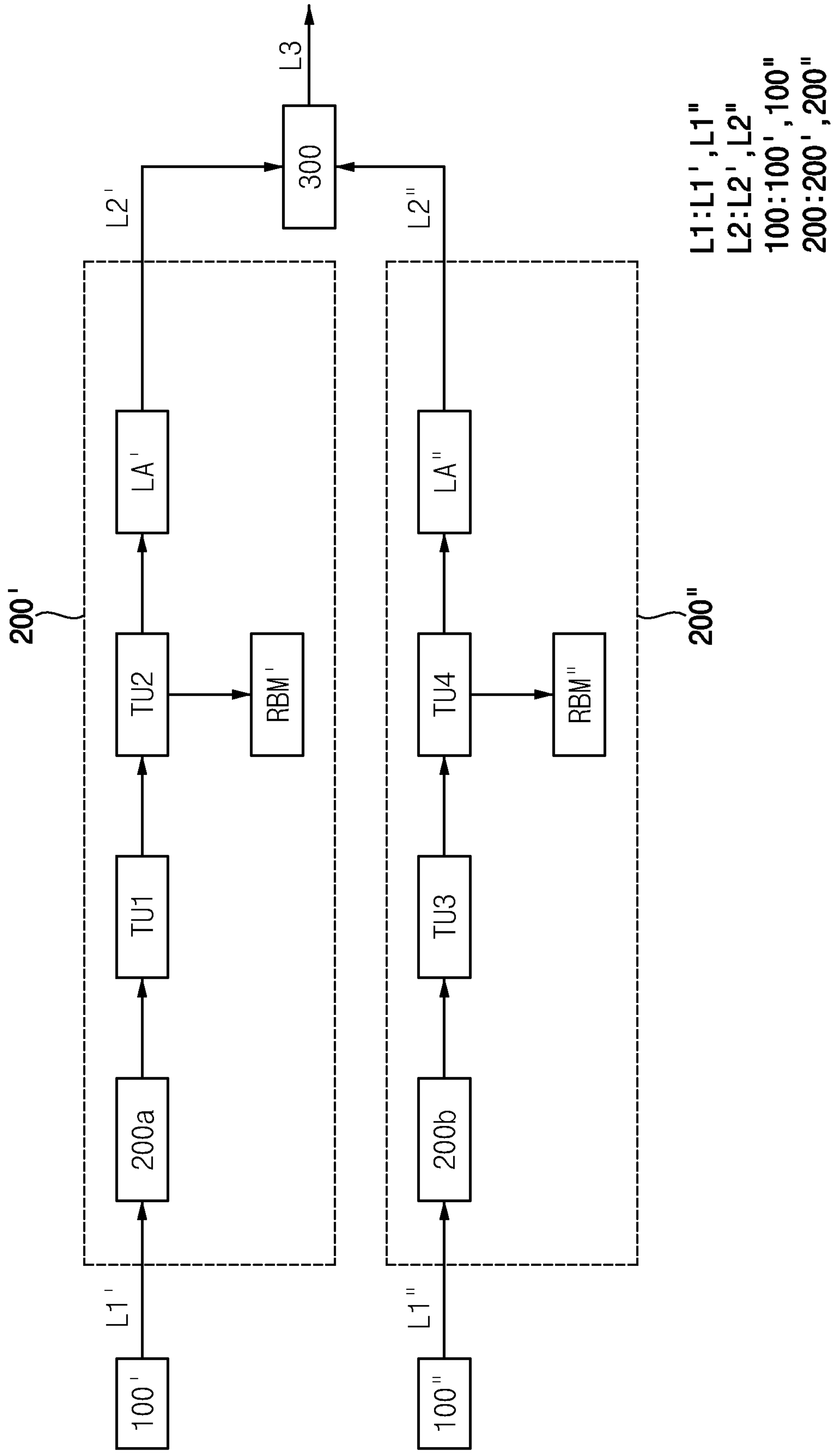
FIGS. 4, 5, and 6 are views illustrating the laser device of FIG. 1.
Figure 5:
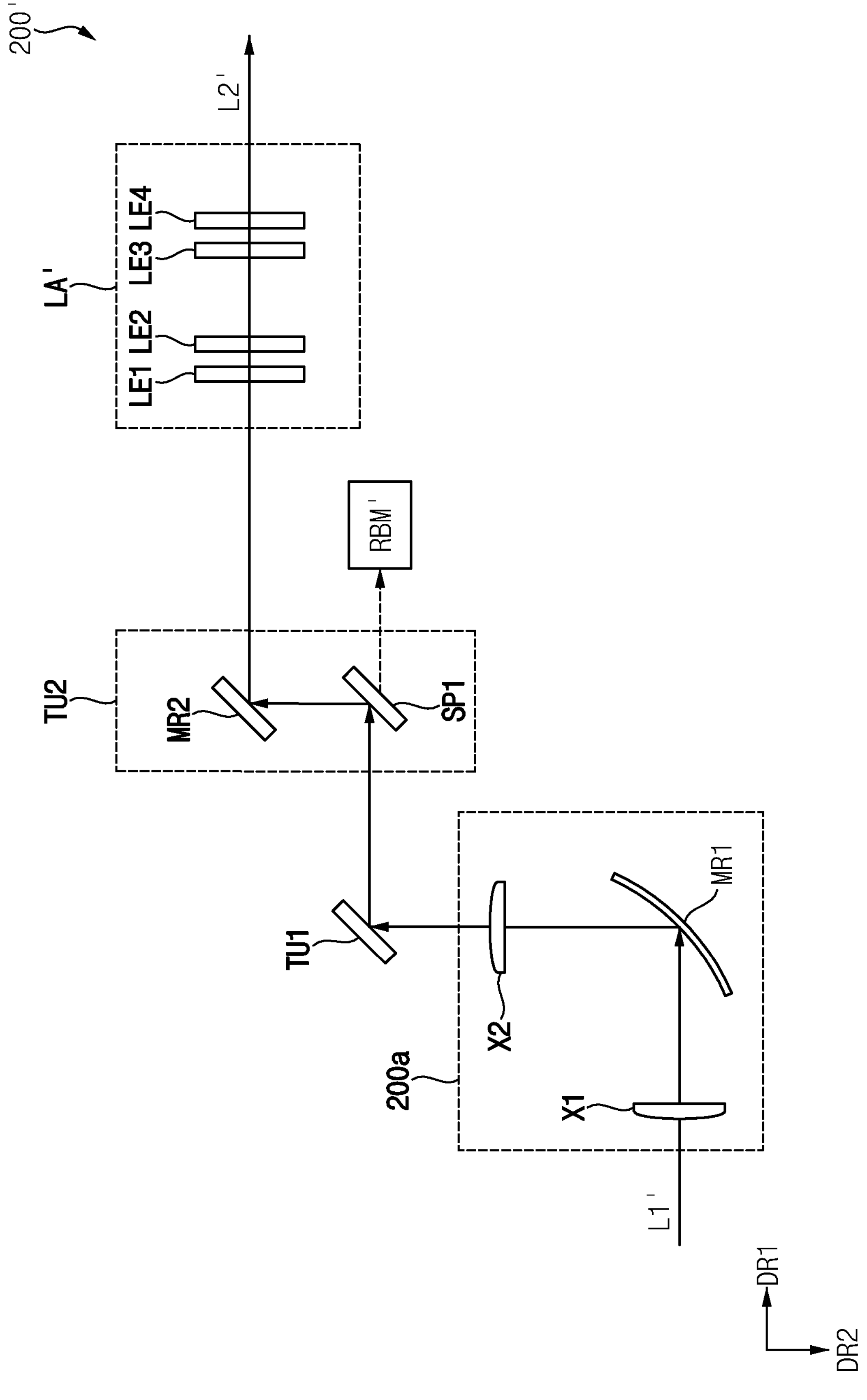
Figure 6:
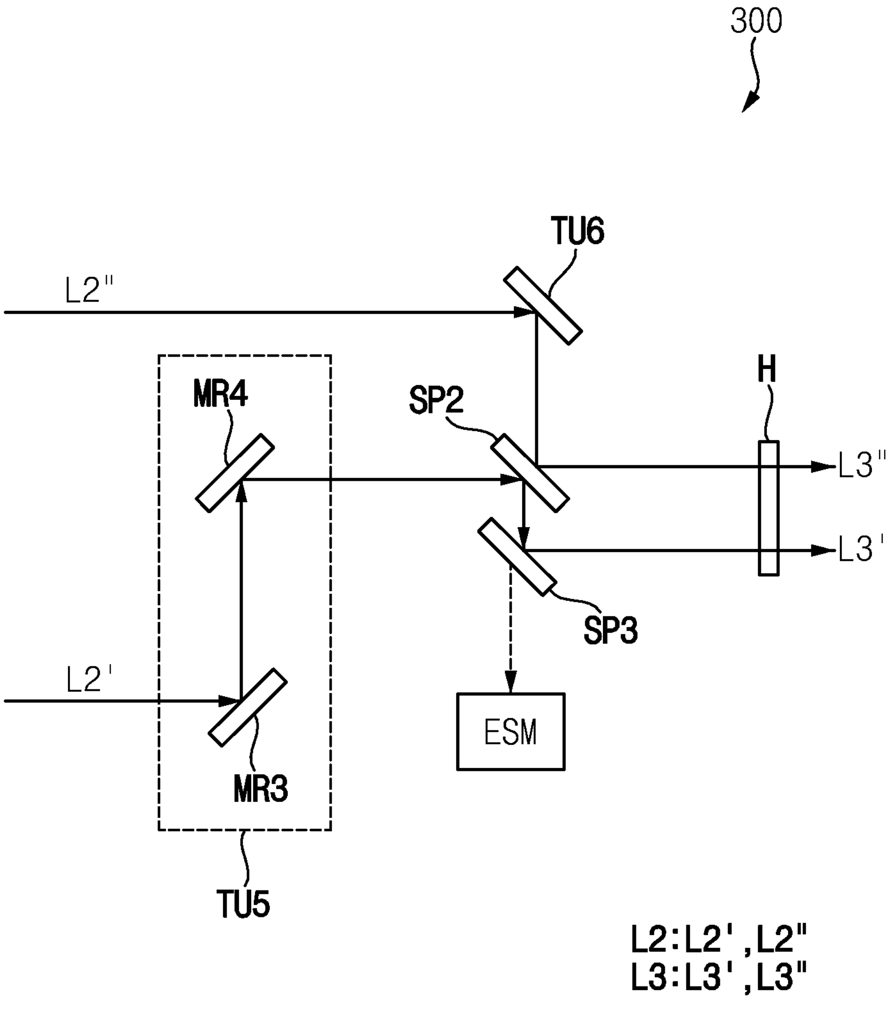

FIGS. 4, 5, and 6 are views illustrating the laser device of FIG. 1.

For example, FIG. 4 is a view illustrating the beam generator 100, the beam converter 200, and the beam homogenizer 300 included in the laser device of FIG. 1. FIG. 5 is a view illustrating a first beam converter 200' included in the beam converter 200 of FIG. 4. A configuration of a second beam converter 200" of FIG. 4 may be substantially a same as a configuration of the first beam converter 200' shown in FIG. 5. FIG. 6 is a view illustrating the beam homogenizer 300 of FIG. 4. Herein, the laser device LD as described above with reference to FIGS. 1, 2, and 3 will be omitted or simplified.

Referring to FIGS. 1, 4, and 5, the beam generator 100 including a first beam generator 100' and a second beam generator 100" may provide the first laser beam L1 to the beam converter 200. Specifically, a first beam generator 100' may provide a first laser beam L1' according to an embodiment to the first beam converter 200'. A second beam generator 100" may provide a first laser beam L1" according to an embodiment to the second beam converter 200".

The first laser beam L1 may be a linear laser beam. In an embodiment, each of the first laser beam L1' according to an embodiment and the first laser beam L1" according to an embodiment may be substantially a same laser beam. However, the embodiments are not limited thereto, the first laser beam L1' according to an embodiment and the first laser beam L1" according to an embodiment may be a beam that has different optical properties such as phase, intensity, or the like.

The beam converter 200 may provide the second laser beam L2 to the beam homogenizer 300. Specifically, the first beam converter 200' may provide a second laser beam L2' according to an embodiment to the beam homogenizer 300. The second beam converter 200" may provide a second laser beam L2" according to an embodiment to the beam homogenizer 300.

In an embodiment, the first laser beam L1 and the second laser beam L2 may have the same phase. The first beam converter 200' may provide the second laser beam L2' according to an embodiment having the same phase as the re-inversion phase of the first laser beam L1' according to an embodiment. The second beam converter 200" may provide the second laser beam L2" according to an embodiment having the same phase as the re-inversion phase of the first laser beam L1" according to an embodiment.

The beam homogenizer 300 may provide the plurality of third laser beams L3 whose energy distribution is relatively homogenized more than each of the second laser beam L2' according to an embodiment and the second laser beam L2" according to an embodiment.

The first beam converter 200' may include a first optical system 200*a*, a first transfer optical system TU1, a second transfer optical system TU2, and a first lens array LA'.

The first laser beam L1' according to an embodiment provided from the first beam generator 100' may pass through sequentially the first optical system 200*a*, the first transfer optical system TU1, the second transfer optical system TU2, and the first lens array LA'. The second laser beam L2' according to an embodiment provided from the first lens array LA' may be provided to the beam homogenizer 300.

In addition, the first beam converter 200' may further include a first beam stabilization unit and a first raw beam monitoring unit RBM'. The first beam stabilization unit may adjust a long axis and a short axis of the raw laser beam. The first beam stabilization unit may stabilize the beam by automatically adjusting a position of the long axis and a position of the short axis of the raw laser beam. The first raw beam monitoring unit RBM' may inspect a variation, e.g., phase distribution, of a laser beam passing through the second transfer optical system TU2.

The first beam converter 200' and the second beam converter 200" may be substantially the same. For example, each of the first optical system 200*a*, the first transfer optical system TU1, the second transfer optical system TU2, the first lens array LA', and the first raw beam monitoring unit RBM' may correspond to each of a second optical system 200*b*, a third transfer optical system TU3, a fourth transfer optical system TU4, a second lens array LA", and a second raw beam monitoring unit RBM". In addition, the first and second optical systems 200*a* and 200*b* may be substantially the same as the beam converter 200 described above with reference to FIG. 3.

Herein, the first optical system 200*a* will be mainly described with reference to FIG. 5.

Referring to FIG. 5, the first beam converter 200' may include the first optical system 200*a*, the first transfer optical system TU1, the second transfer optical system TU2, the first lens array LA', and the first raw beam monitoring unit RBM'.

The first laser beam L1' according to an embodiment may be converted into the second laser beam L2' according to an embodiment by passing through sequentially the first optical system 200*a*, the first transfer optical system TU1, the second transfer optical system TU2, and the first lens array LA'.

The first optical system 200*a* may include the first lens X1, the curved mirror MR1, and the second lens X2. The first laser beam L1' according to an embodiment may pass through the first lens X1 and then reflected at the curved mirror MR1, and the laser beam reflected from the curved mirror MR1 may incident to the second lens X2.

The laser beam emitted from the first optical system 200*a* may be transferred to the second transfer optical system TU2 through the first transfer optical system TU1. To this end, the first transfer optical system TU1 may include at least one mirror.

The second transfer optical system TU2 may include a first splitter SP1 and a second mirror MR2. The first splitter SP1 may reflect some of the laser beam emitted from the first transfer optical system TU1 and may transmit other of the laser beam.

The laser beam reflected by the first splitter SP1 may transfer to the first lens array LA' by reflecting from the second mirror MR2. The laser beam transferred through the first splitter SP1 may be transferred to the first raw beam monitoring unit RBM'. The first raw beam monitoring unit RBM' may inspect the variation, e.g., the phase distribution, of the laser beam transferred through the first splitter SP1.

The first lens array LA' may include a plurality of lenses LE1, LE2, LE3, and LE4. In an embodiment, the first lens array LA' may include a short-axis homogenizing lens array and a long-axis homogenizing lens array. For example, the short-axis homogenizing lens array may include a first short-axis homogenizing lens LE1 and a second short-axis homogenizing lens LE4. The long-axis homogenizing lens array may include a first long-axis homogenizing lens LE2 and a second long-axis homogenizing lens LE3.

The short-axis homogenizing lens array may homogenize the laser beam in a direction, and the long-axis homogenizing lens array may homogenize the laser beam in another direction crossing the direction. Accordingly, the laser beam emitted from the second transfer optical system TU2 may pass through the first lens array LA' and may be homogenized in the direction and the another direction.

In an embodiment, the long-axis homogenizing lens array may be disposed between the first short-axis homogenizing lens LE1 and the second short-axis homogenizing lens LE4. In an embodiment, the laser beam emitted from the second transfer optical system TU2 may pass through, in turn, the first short-axis homogenizing lens LE1, the first long-axis homogenizing lens LE2, the second long-axis homogenizing lens LE3, and the second short-axis homogenizing lens LE4.

In an embodiment, the short-axis homogenizing lens array may be disposed between the first long-axis homogenizing lens LE2 and the second long-axis homogenizing lens LE3. That is, the laser beam emitted from the second transfer optical system TU2 may pass through, in turn, the first long-axis homogenizing lens LE2, the first short-axis homogenizing lens LE1, the second short-axis homogenizing lens LE4, and the second long-axis homogenizing lens LE3.

Referring to FIGS. 4 and 6, the beam homogenizer 300 may include a fifth transfer optical system TU5, a sixth transfer optical system TU6, a second splitter SP2, a third splitter SP3, a homogenizer H, and an energy sigma monitoring unit ESM.

The fifth transfer optical system TU5 may transfer the second laser beam L2' to the second splitter SP2 by reflecting the second laser beam L2' according to an embodiment. To this end, the fifth transfer optical system TU5 may include a third mirror MR3 and a fourth mirror MR4. The third mirror MR3 may reflect the second laser beam L2' according to an embodiment. The fourth mirror MR4 may transferred to the second splitter SP2 by reflecting the second laser beam L2' according to an embodiment reflected from the third mirror MR3. In this case, the second laser beam L2' according to an embodiment may incident to a first surface of the second splitter SP2.

The sixth transfer optical system TU6 may be transferred to the second splitter SP2 by reflecting the second laser beam L2" according to an embodiment. To this end, the sixth transfer optical system TU6 may include at least one mirror. In this case, the second laser beam L2" according to an embodiment may incident to a second surface of the second splitter SP2. The second surface may opposite to the first surface.

The second splitter SP2 may reflect some of the second laser beam L2' according to an embodiment reflected from the fifth transfer optical system TU5 and may transmit other of the second laser beam L2' according to an embodiment. In addition, the second splitter SP2 may reflect some of the second laser beam L2'" according to an embodiment reflected from the sixth transfer optical system TU6 and may transmit other of the second laser beam L2'" according to an embodiment.

The second laser beam L2' according to an embodiment transmitted from the second splitter SP2 and the second laser beam L2" according to an embodiment reflected from the second splitter SP2 may be transferred to the homogenizer H. The second laser beam L2' according to an embodiment reflected from the second splitter SP2 and the second laser beam L2" according to an embodiment transmitted from the second splitter SP2 may be transferred to the third splitter SP3.

The third splitter SP3 may reflect some of the laser beam received from the second splitter SP2 and may transmit other of the laser beam. The laser beam reflected from the third splitter SP3 may be transferred to the homogenizer H, and the laser beam transferred through the third splitter SP3 may be transferred to the energy sigma monitoring unit ESM. Accordingly, the energy sigma monitoring unit ESM may inspect a waveform characteristic of the laser beam transmitted through the third splitter SP3.

The homogenizer H may homogenize the laser beam transferred from the second splitter SP2 and the third splitter SP3, and may convert the transferred laser beam into the plurality of third laser beams L3, e.g., third laser beams L3' and L3". Specifically, the beam homogenizer 300 may mix the second laser beam L2' according to an embodiment and the second laser beam L2" according to an embodiment. Accordingly, the plurality of third laser beams L3 having more homogeneous energy distribution than that of the second laser beam L2 may be formed.

In FIGS. 4, 5, and 6, it has been described that the laser device LD includes all of the first and second optical systems 200*a* and 200*b*. However, embodiments of the disclosure are not limited thereto. The laser device LD may include only the first optical system 200*a*. Alternatively, the laser device LD may include only the second optical system 200*b*.

The laser device LD according to an embodiment of the disclosure may improve the beam distribution by including the beam converter 200. In addition, the beam converter 200 may reduce the cost of the additional part and may minimize the size of the equipment by disposing the curved mirror MR1 between the first lens X1 and the second lens X2.

An organic light emitting display device and various electronic devices including the same may be manufactured using the optical system and the laser device including the optical system of the present disclosure. For example, the present disclosure may be applied in manufacturing any of mobile phones, smartphones, video phones, smart pads, smart watches, tablet PCs, car navigation systems, televisions, computer monitors, notebooks, head mounted displays, or the like.

Although some embodiments have been described with reference to the drawings, the illustrated embodiments are provided as examples, and may be modified and changed by a person having ordinary knowledge in the relevant technical field without departing from the technical spirit set forth in the following claims.

What is claimed is:

1. An optical system comprising:

a first lens including a first surface and a second surface opposite to the first surface, and having a first focal length;

a second lens including a third surface and a fourth surface opposite to the third surface, and having a second focal length; and a curved mirror disposed on a traveling path of a first laser beam passing through the first lens and changing the traveling path of the first laser beam to enter the second lens by reflecting the first laser beam, wherein the curved mirror includes a fifth surface and a sixth surface opposite to the fifth surface, and each of the fifth surface of the curved mirror, which reflects the first laser beam, and the sixth surface of the curved mirror has a concave curved shape in a direction away from the first lens and the second lens, and a curvature of the fifth surface is the same as a curvature of the sixth surface, and wherein the second lens is spaced apart from the curved mirror by a sum of the first focal length and the second focal length.

2. The optical system of claim 1, wherein a focal point of the first lens toward the curved mirror is a first focal point, and a focal point of the second lens toward the curved mirror is a second focal point, the first focal point is between the first lens and the curved mirror, and the second focal point is between the curved mirror and the second lens.

3. The optical system of claim 2, wherein the first focal length is smaller than the second focal length.

4. The optical system of claim 3, wherein magnification between the first lens and the curved mirror is greater than or equal to about 1.2 and less than or equal to about 1.6, and the magnification is defined as a value obtained by dividing the second focal length by the first focal length.

5. The optical system of claim 1, wherein a separation distance between the first lens and a center of the curved mirror is a same as a separation distance between the second lens and the center of the curved mirror.

6. The optical system of claim 1, wherein a radius of curvature of the curved mirror is greater than or equal to about 500 millimeters and less than or equal to about 1500 millimeters.

7. The optical system of claim 1, wherein an optical axis of the first lens and an optical axis of the second lens are perpendicular to each other.

8. The optical system of claim 1, wherein the second surface of the first lens and the third surface of the second lens are adjacent to the curved mirror, the first surface has a convex curved shape in a direction away from the curved mirror, and the fourth surface has a convex curved shape in a direction away from the curved mirror.

9. The optical system of claim 1, wherein each of the first lens and the second lens is a telecentric lens.

10. A laser device comprising:

a beam generator that emits a first laser beam; and an optical system comprising:

a first lens including a first surface and a second surface opposite to the first surface, and having a first focal length;

a second lens including a third surface and a fourth surface opposite to the third surface, and having a second focal length; and a curved mirror disposed on a traveling path of the first laser beam passing through the first lens and changing the traveling path of the first laser beam to enter the second lens by reflecting the first laser beam, wherein the curved mirror includes a fifth surface and a sixth surface opposite to the fifth surface, and each of the fifth surface of the curved mirror, which reflects the first laser beam, and the sixth surface of the curved mirror has a concave curved shape in a direction away from the first lens and the second lens, and a curvature of the fifth surface is the same as a curvature of the sixth surface, and wherein the second lens is spaced apart from the curved mirror by a sum of the first focal length and the second focal length.

11. The laser device of claim 10, wherein magnification between the first lens and the curved mirror is greater than or equal to about 1.2 and less than or equal to about 1.6, and the magnification is defined as a value obtained by dividing the second focal length by the first focal length.

12. The laser device of claim 10, wherein a separation distance between the first lens and a center of the curved mirror is a same as a separation distance between the second lens and the center of the curved mirror.

13. The laser device of claim 10, wherein a radius of curvature of the curved mirror is greater than or equal to about 500 millimeters and less than or equal to about 1500 millimeters.

14. The laser device of claim 10, wherein an optical axis of the first lens and an optical axis of the second lens are perpendicular to each other.

15. The laser device of claim 14, wherein each of the first lens and the second lens is a telecentric lens.

* * * * *